United States Patent [19]
Koskenmaki et al.

[11] Patent Number: 5,443,876
[45] Date of Patent: Aug. 22, 1995

[54] ELECTRICALLY CONDUCTIVE STRUCTURED SHEETS

[75] Inventors: David C. Koskenmaki, St. Paul; Clyde D. Calhoun, Stillwater, both of Minn.

[73] Assignee: Minnesota Mining and Manufacturing Company, St. Paul, Minn.

[21] Appl. No.: 175,921

[22] Filed: Dec. 30, 1993

[51] Int. Cl.6 ............................................. A61F 13/02
[52] U.S. Cl. ........................... 428/40; 428/323; 428/343
[58] Field of Search ................... 428/323, 40, 343

[56] References Cited

U.S. PATENT DOCUMENTS

| | | | |
|---|---|---|---|
| 3,680,037 | 7/1972 | Nellis et al. | 339/61 M |
| 4,008,300 | 2/1977 | Ponn | 264/104 |
| 4,292,261 | 9/1981 | Kotani et al. | 264/24 |
| 4,448,837 | 5/1984 | Ikeda et al. | 428/215 |
| 4,546,037 | 10/1985 | King | 428/323 |
| 4,548,862 | 10/1985 | Hartman | 428/323 |
| 4,644,101 | 2/1987 | Jin et al. | 178/18 |
| 4,737,112 | 4/1988 | Jin et al. | 439/66 |
| 4,820,376 | 4/1989 | Lambert et al. | 156/643 |
| 4,838,347 | 6/1989 | Dentini et al. | 165/185 |
| 5,087,494 | 2/1992 | Calhoun et al. | 428/40 |
| 5,141,790 | 8/1992 | Calhoun et al. | 428/40 |
| 5,192,548 | 3/1993 | Velasquez et al. | 424/443 |
| 5,275,856 | 1/1994 | Calhoun et al. | 428/40 |

*Primary Examiner*—Edith Buffalow
*Attorney, Agent, or Firm*—Gary L. Griswold; Walter N. Kirn; Christine T. O'Shaughnessy

[57] ABSTRACT

The present invention provides electrically conductive sheet materials that contain columns of electrically conductive particles aligned to form continuous columns between lateral faces of the conductive sheet material. The particle columns are arranged so that the sheet is conductive through the thickness, but is electrically insulating in lateral directions. The present invention also provides methods by which such electrically conductive sheet materials can be made. The present invention is able to provide conductive pathways in a precise, regular array, at a very fine pitch.

15 Claims, 3 Drawing Sheets

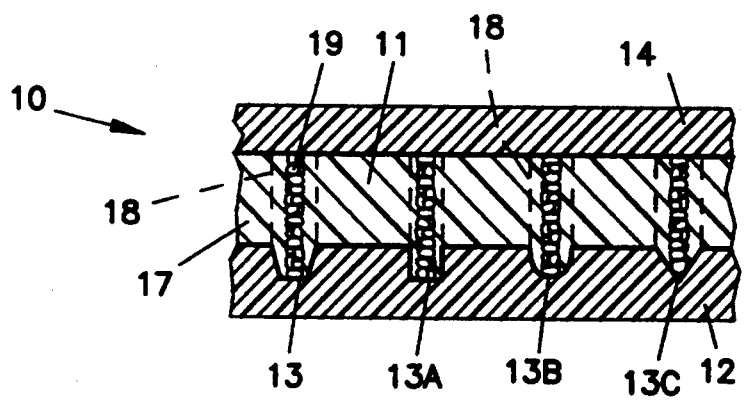
FIG. 1
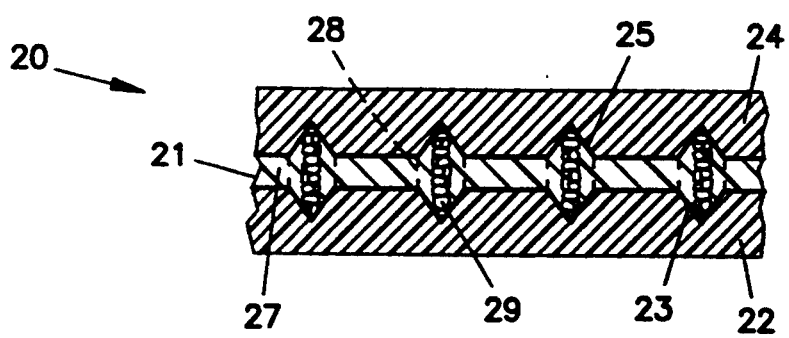
FIG. 2
FIG. 3
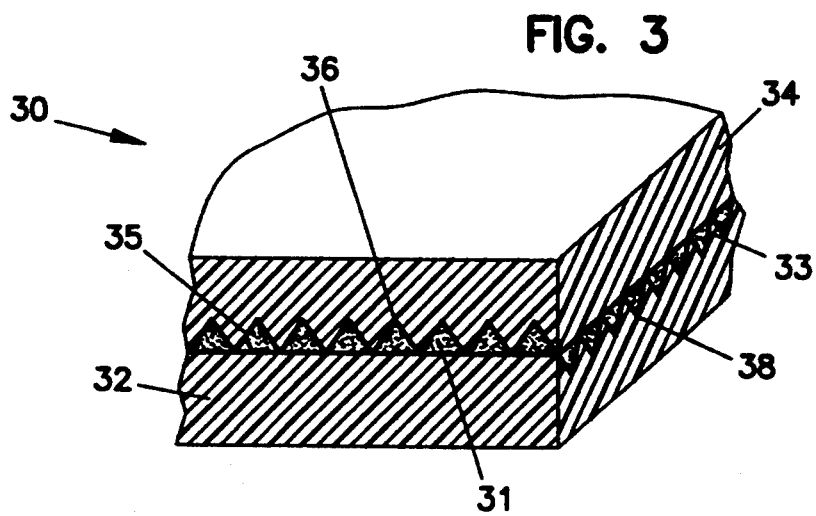
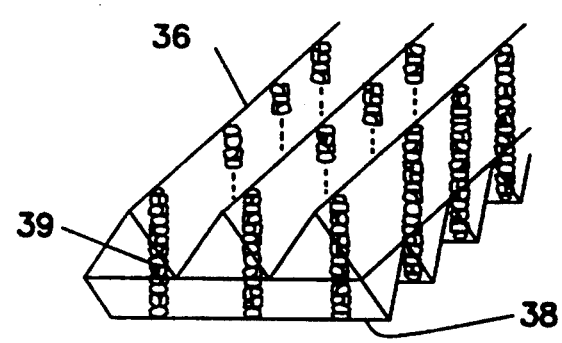
FIG. 3A

ELECTRICALLY CONDUCTIVE STRUCTURED SHEETS

FIELD OF THE INVENTION

This invention relates to electrically conductive sheets that contain columns of electrically conductive particles. The particle columns are arranged so that the sheet is conductive through the thickness, but is electrically insulating in lateral directions.

BACKGROUND OF THE INVENTION

As electronic devices become smaller, the requirements for precise electrical connection at extremely fine pitch continue to increase. As an example, semiconductors, such as integrated circuits, are formed on wafers that are then cut into dice or chips that individually may be mounted on substrates. Typically, the substrate has fine electrically conductive circuit lines, and electrical and thermal contact must be made between the substrate and chip. As electronic appliances, such as computers, tape players, televisions, telephones, and other appliances become smaller, thinner, and more portable, the size requirements for semiconductors and the means for providing electrical connection between semiconductors and substrates, or between flexible circuits and rigid printed circuits, become increasingly demanding.

One method for providing electrical conductivity between two electrical elements, is through the use of a Z-axis conductive sheet material, such as a Z-axis adhesive. Whether the sheet material is an elastomer or an adhesive, the continuing challenge is to keep pace with the miniaturization in the electronics industry. Z-axis conductivity can be achieved through a number of means, including dispersing conductive particles throughout a binder matrix. Where electrical connection on a very fine pitch is required, the conductive elements may be placed only where the electrodes are located, typically requiring indexing the conductive sheet to the electrodes, or the conductive elements may be placed at such close spacing, relative to the spacing of the electrodes, that indexing is not required. U.S. Pat. No. 5,087,494, (Calhoun et al) is an example of an electrically conductive adhesive tape having conductive particles placed at precise locations, on a fine pitch. The Calhoun et al '494 patent also discusses a number of available options for electrically conductive adhesive tapes.

U.S. Pat. No. 4,008,300 (Ponn) and U.S. Pat. No. 3,680,037 (Nellis, et al.), teach a dielectric sheet material having a plurality of compressible resilient conductive plugs that extend between the faces of the sheet. The sheet can be placed between circuits to make electrical connection there between. The conductive plugs of Ponn and Nellis are dispersions of conductive particles in a binder material.

Other patents teach orienting magnetic particles dispersed in a binder by applying a magnetic field, e.g., U.S. Pat. Nos. 4,448,837 (Ikade, et al.); 4,546,037 (King); 4,548,862 (Hartman); 4,644,101 (Jin, et al.); and 4,838,347 (Dentinni). The distribution of the particles after orientation and curing is sufficiently uniform to be functional for certain applications, but is insufficient for other applications. If the number of particles used in these articles were to be increased in an attempt to reach smaller spacings for finer pitch connections, agglomeration would likely occur thereby causing shorting. Accordingly, there is a need for a fine pitch means of providing electrical interconnection between two surfaces in a precise manner, at an extremely fine pitch.

Another deficiency in prior attempts to make electrical interconnection utilizing electromagnetic particles is that the bonding surface is not conducive to ready interconnection between two conductive surfaces.

SUMMARY OF INVENTION

The present invention provides an electrically conductive sheet material comprising a polymeric sheet having first and second faces, the first face includes a regular array of protrusions extending therefrom. A plurality of magnetic columns, each column including individual electrically conductive ferromagnetic particles aligned to form a continuous column, between the first face and the second face. The magnetic columns are aligned with the protrusions, with each column extending from a protrusion to the second face. The regions lying between the protrusion and the second face will be referred to herein as "conductive corridors," while the region that surrounds the conductive corridors will be referred to as a "dielectric region."

The second face may also include a plurality of protrusions so that each magnetic column is aligned in a conductive corridor extending between a protrusion in the first face and a protrusion in the second face. The polymeric sheet may be an adhesive, an elastomer, or other type of polymer, and may optionally include ferromagnetic or other metal particles dispersed therein. Release liners may be provided on one or both faces of the sheet material. The release liners will typically include a plurality of recesses corresponding to the regular array of protrusions extending from a face, with each protrusion positioned in a recess so as to protect the protrusion and magnetic column.

As used herein, "regular array" means an array that is not random, but rather has a pattern that is repeatable.

The present invention also provides an electrically conductive sheet material comprising a polymeric sheet having first and second faces, with the first face having a first set of longitudinally extending, parallel ridges formed therein, and the second face having a second set of such ridges formed therein. The first set of ridges crosses or intersects the second set of ridges, preferably perpendicularly. A plurality of magnetic columns, each column including individual electrically conductive ferromagnetic particles aligned to form a continuous column, extend from the first face to the second face, with the magnetic columns positioned at the grid points of the first and second set of ridges. As used herein, "grid points" are the points at which the first set of ridges would intersect the second set of ridges if the ridges were in the same plane. In other words, viewing the sheet material from above and perpendicular to one of the faces, the grid points would appear to be the points of intersection between the respective sets of ridges. Release liners, having groves corresponding to the plurality of ridges, may be provided on one or both faces of the sheet material.

The present invention provides a method of forming electrically conductive sheet materials comprising the steps of providing a carrier web having a plurality of recesses in a first face, providing ferromagnetic particles in the recesses, providing a binder layer over the first face, and applying a magnetic field sufficient to align the ferromagnetic particles into continuous magnetic columns, each column extending from a recess in the carrier web. The ferromagnetic particles are typically coated in a slurry of particles and binder, the binder used in the slurry may be the same as the binder layer coated over the first face. Upon curing or otherwise hardening, the binder layer may be an adhesive layer, an elastomeric layer, or another type of dielectric material. A second carrier web, having a second face, optionally including a plurality of recesses, may be provided over the binder layer. The recesses in the second face may also optionally include ferromagnetic particles provided therein.

The present invention also provides a method of forming electrically conductive sheet materials comprising the steps of providing a first carrier web having a first set of parallel grooves formed therein, coating a dispersion of ferromagnetic particles in a binder layer into the grooves. A second carrier web having a second set of parallel grooves is positioned in an intersecting arrangement relative to the first set of grooves, preferably perpendicularly. A dispersion of ferromagnetic particles in a binder layer may also be provided in the second set of grooves. A magnetic field sufficient to align the magnetic particles into continuous magnetic columns is applied, with the magnetic columns positioned at the grid points of the first and second set of groves. An additional binder layer may be placed between the first and second set of groves to increase the thickness of the sheet material.

The present invention also provides a method by which electrically conductive sheet materials of the present invention can be formed comprising the steps of providing a first carrier web having a first set of continuous recesses in a first face, coating a dispersion of ferromagnetic particles in a binder layer over the first face, providing a second flexible carrier web having a second face, optionally including a second set of continuous recesses, over said binder layer. A magnetic field is applied that is sufficient to align the ferromagnetic particles into continuous magnetic columns, each column extending from a recess in the first face. Where recesses are also provided in the second face, the continuous columns will extend from a recess in the first face to a recess in the second face.

As used herein, "continuous recesses" refers to a surface having a plurality of recesses that connect with adjacent recesses so as to form a surface substantially free of planar regions. For example, a grid of four-sided pyramids or cube corners would provide a surface having continuous recesses.

BRIEF DESCRIPTION OF THE DRAWINGS

FIG. 1 is a schematic cross-sectional view of an electrically conductive sheet material of the present invention;

FIG. 2 is a schematic cross-sectional view of an electrically conductive sheet material of the present invention;

FIG. 3 is a schematic cross-sectional and perspective view of an electrically conductive sheet material of the present invention;

FIG. 3A is a perspective view of an electrically conductive sheet material of the present invention;

DETAILED DESCRIPTION OF THE PRESENT INVENTION

Figure 4:
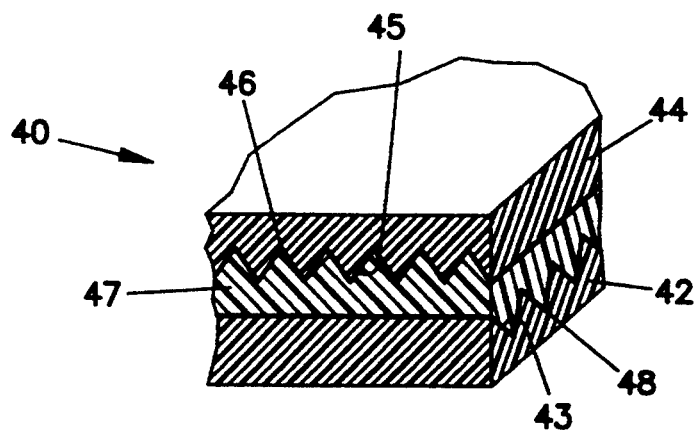
FIG. 4 is a schematic cross-sectional view of an electrically conductive sheet material of the present invention.

The present invention provides electrically conductive sheet materials that include a plurality of magnetic columns, each column including individual magnetic particles aligned to form a continuous conductive column, extending through the thickness of the electrically conductive sheet material. The present invention also provides methods by which such electrically conductive sheet materials can be made.

The invention provides a structured dielectric retainer or binder layer that has conductive elements arranged in a predetermined pattern that corresponds to protrusions on a microstructured surface of the dielectric retainer. The conductive elements span the thickness of the dielectric retainer at the protrusions, which are typically the thickest portions of the dielectric layer. The conductive magnetic columns can be provided in a regular array that corresponds to the protrusions in the surface of the dielectric binder. Conductive corridors are defined that extend from a protrusion in one surface to the opposing surface of the binder. Protrusions may be provided in both lateral surfaces of the binder layer with the conductive corridors extending from one protrusion in the first surface to a protrusion aligned therewith in the second surface. Ideally, a single continuous magnetic chain will form in a conductive corridor, and will bridge the two lateral faces of the binder layer. However, a conductive corridor may contain, for example, a branched chain or a double chain, that may be caused by, for example, irregularities in the shape of the magnetic particles.

The present invention is able to provide conductive pathways in a precise, regular array at a very fine pitch. The conductive corridors containing continuous magnetic chains can be positioned in a desired pattern with great precision, and with extremely fine spacing between each conductive corridor. A dielectric region will surround the array of conductive corridors, and unlike random arrays of magnetic columns, can be made to be substantially free of magnetic particles or magnetic columns. Unwanted random chains or particles can cause shorting or other problems associated with electrical interconnection.

To make conductive sheet materials of the invention, recesses in an embossed carrier web may be filled with a dispersion of a binder and conductive ferromagnetic particles. There is complete control over where the recesses are located: any geometric shape or mixture of shapes, any size or mixture of sizes, and any separation or family of separation distances, can be accomplished. The placement of the recesses also determines the placement of the magnetic columns. The particle/binder filled recesses may be covered with an additional binder coating of adhesive, elastomer, or other type of polymer. An optional second embossed sheet (optionally with its recesses filled with a slurry of ferromagnetic particles and binder) can be laminated to the first sheet, or an unembossed cover sheet may be used. The assembly is then placed in a magnetic field, to form chains of particles that connect the protruding microfeatures on each side of the binder, and while in this state of magnetic orientation the dielectric binder is cured or otherwise hardened. It may be necessary to provide indexing between the recesses in a first face and the recesses in a second face to promote the formation of single magnetic columns extending from one face to the other. One option whereby indexing is not required includes providing finer scale recesses in the second face to ensure that each recess in the first face aligns with at least one recess in the second face.

Where the recesses in the carrier web are grooves, it has been found that one or both sets of grooves can be filled with a dispersion loaded with conductive magnetic particles and the two like sheets brought into contact with each other, with the angle between the grooves preferably 90 degrees. Magnetic columns are formed at the grid points of the sets of groves. An additional binder layer may be provided between the two sets of grooved carrier webs to increase the thickness of the final sheet material.

Where a dispersion of magnetic particles is coated between two carrier webs, with at least one of the carrier webs having an array of continuous recesses formed therein, the continuous magnetic columns are also formed by applying a magnetic field to the particles to form continuous magnetic columns extending from the recesses in the carrier webs. It has been found that magnetic particles placed in a sufficient magnetic field seek to form chains having the maximum possible length parallel to the magnetic lines of flux. Accordingly, there is a tendency for the columns to form extending from the recesses in the carrier web so that the length of the chain is as long as possible. It is preferred that where a dispersion of ferromagnetic particles is coated over the entire carrier web, rather than coating a dispersion of particles directly into the recesses, that the recesses be formed in a continuous pattern. If the carrier web has planar surfaces between the recesses, unwanted, out-of-position columns may form between the recesses. To achieve the desired regular array of precisely spaced columns, a pattern of continuous recesses is used so that the chains tend to form only in the recesses, rather than between them.

In use, the release liner(s) (carrier webs) are removed from the structured, particle oriented, conductive sheet material of the invention. If the dielectric binder used in the conductive sheet material is an adhesive, the sheet is capable of both bonding and electrically connecting two sets of electrodes. When the dielectric binder is not an adhesive, it may be necessary to use some clamping force to hold the conductive sheet material between two sets of electrodes.

Referring to FIG. 1, an electrically conductive sheet material generally designated 10 is shown. The sheet material 10 includes a first carrier web 12 having recesses 13, 13A, 13B, and 13C formed therein, and a second carrier web 14. Typically, recesses will be of a single size and shape, but FIG. 1 illustrates a few of the many possible recesses that may be utilized. Binder layer 11 is provided between carrier webs 12 and 14. Conductive corridors 18 are defined as the region between the recesses 13, 13A, 13B, 13C and the web 14. The dielectric region 17 is the remainder of the binder 11 with conductive magnetic columns 19, extending between the recesses 13, 13A, 13B, 13C and the second carrier web 14.

Referring to FIG. 2, an electrically conductive sheet material generally designated 20 is shown. The sheet material 20 includes a first carrier web 22 with recesses 23 formed therein and a second carrier web 24 with recesses 25 formed therein. A binder layer 21 is provided between carrier webs 22 and 24 and includes a dielectric region 27 and conductive corridors 28. Conductive magnetic columns 29 extend between recesses 23 and recesses 25, lying in conductive corridors 28.

Referring to FIG. 3, an electrically conductive sheet material generally designated 30 is shown. The sheet material 30 includes a first carrier web 32 having a plurality of grooves 33 formed therein, and a second carrier web 34 having a plurality of grooves 35 formed therein. The grooves 33 are positioned so as to be perpendicular to the grooves 35. A binder material 31 is provided between the carrier webs 32 and 34 in the grooves 33 and 35, to form ridges 36 and 38, respectively. As shown in FIG. 3A, magnetic columns 39 extend between ridges 36 and ridges 38 at the points at which the ridges would cross or intersect if the grooves were in the same plane (i.e. grid points).

Figure 4A:
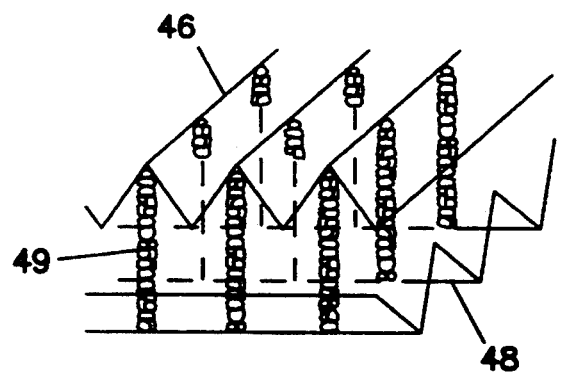
FIG. 4A is a perspective view of an electrically conductive sheet material of the present invention.

Referring to FIGS. 4 and 4A, an electrically conductive sheet material generally designated 40 is shown. The sheet material 40 includes a first carrier web 42 having grooves 43 formed therein which contain ferromagnetic particles (not shown), and a second carrier 44 having grooves 45 formed therein. A binder layer 47 is provided between the carrier web 42 and the carrier 44 forming ridges 46 and 48, in the grooves 43 and 45. As shown in FIG. 4A, magnetic columns 49 extend between ridges 46 and ridges 48.

Figure 5:
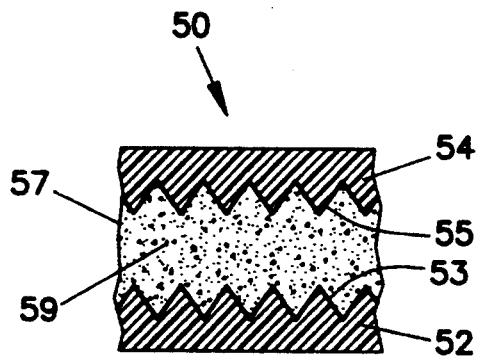
FIG. 5 is a schematic cross-sectional view of a precursor of electrically conductive sheet material of the present invention prior to alignment of the magnetic particles.

Referring to FIG. 5, a precursor of an electrically conductive sheet material generally designated 50 is shown. The sheet material 50 includes a first carrier web 52 with recesses 53 and a second carrier web 54 with recesses 55. A binder material 57 is provided between the first carrier web 52 and the second carrier web 54. Ferromagnetic particles 59 are dispersed in the binder 57.

Figure 5A:
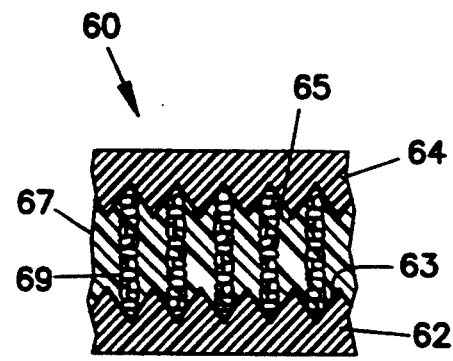
FIG. 5A is a schematic cross-sectional view of an electrically conductive sheet material of the present invention.

Referring to FIG. 5A, an electrically conductive sheet material generally designated 60 is shown. The sheet material 60 includes a first carrier web 62 with recesses 63 and a second carrier 64 with recesses 65. A binder material 67 is provided between first carrier 62 and the second carrier web 64. Magnetic columns 69 extend between the recesses 63 and recesses 65. The electrically conductive sheet material 60 of FIG. 5A is made by applying a magnetic field to the sheet material 50 shown in FIG. 5. The magnetic columns 69 form in the recesses 63 and 65 because this permits the greatest possible length for the magnetic column 69.

Figure 6:
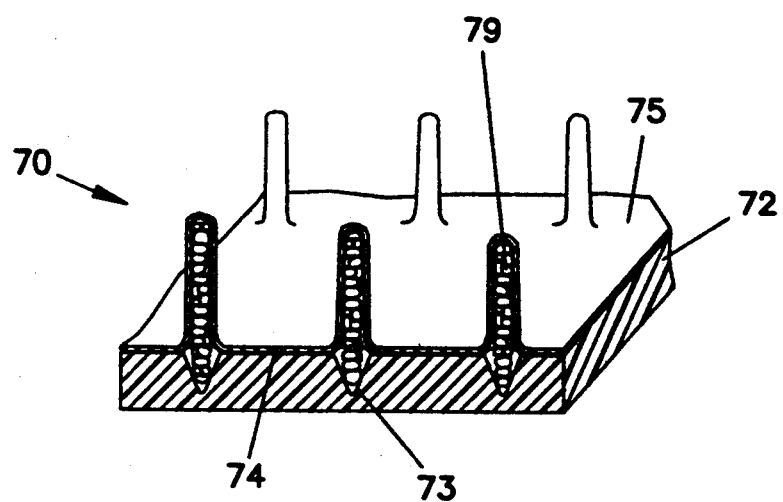
FIG. 6 is a schematic cross-sectional view of an electrically conductive sheet material of the present invention.

Referring to FIG. 6, an electrically conductive sheet material generally designated 70 is shown. Sheet material 70 includes first carrier web 72 having recesses 73 formed therein and binder layer 75 provided over a first face 74 of the web 72 and over conductive magnetic columns 79. Conductive magnetic columns 79 extend from the recesses 73. An additional binder layer (not shown) can be provided over the binder layer 75, for example, an adhesive layer.

The Microstructured Carrier Web

The microstructured carrier web can be a web, roll, endless belt, or other structure having recesses in a planar surface. The carrier web can be made from a variety of materials and by various methods. The function of the carrier web is to precisely place memagnetic columns in the electrically conductive sheet material. A preferred method is to provide a carrier having the desired placement of recesses, flood the surface with a ferromagnetic particle slurry, and wipe with a doctor blade so as to leave particles in the recesses.

The recesses can be a wide variety of shapes and sizes. Shapes include hemispheres, cubes, truncated cones, pyramids, three-sided pyramids, four-sided pyramids, cube corners (see e.g. U.S. Pat. No. 3,924,929), rectangles, two-sided 90° grooves, square-bottomed troughs, and any other desired shape that suits the particular purpose.

One of the advantages of the present invention is the ability to provide magnetic columns at precise, closely spaced locations, typically about 50–500 columns/cm, or 2500–250,000 columns/cm$^2$. The spacing of the columns is dictated by the spacing of the recesses. Where the recesses are grooves the columns will locate themselves at the grid points of the cross-hatched groove sets in the first and second faces. The size of the groove is largely dependent on the desired spacing of the columns. Where the recesses are discrete shapes (e.g., hemisphere, truncated cones) the volume of the recess should be selected, considering the size of the particle and the thickness of the sheet material.

It is preferred that a recess be completely filled with particles so that the level of particles is flush with the face of the carrier web. Ideally, spherical particles of a single size will form a single particle continuous chain, however in actual practice particles are not perfectly spherical nor of a single size. One way to select the volume of the pocket is to consider the desired length of the chain (thickness of the sheet material), and the desired particle size, and determine the volume of the recess required to hold the particles that will form a chain of the desired length.

It appears that there is a limit to the height of the columns in proportion to the spacing. If the spacing of the columns is too close together relative to the length of the columns, branching and other similar problems will occur. An aspect ratio (height of column:pitch) of about 2:1 may be a general upper limit for typical embodiments of the present invention.

The carrier web is preferably a flexible polymeric sheet material. The carrier web having recesses formed in one lateral face can be used in the methods of the present invention to form an electrically conductive sheet material, with the carrier web left in place until the electrically conductive sheet material is used to electrically connect two devices. The thickness of the carrier web will typically be about 25 $\mu$m–250 $\mu$m.

A preferred carrier is an embossed web which can be made either by embossing an existing web or by cast embossing onto a textured chill drum. Common examples of embossed webs are polyethylene or polypropylene coated kraft paper or polyester or thermoplastic films such as polypropylene. Other suitable carrier webs include other film-forming polymers, including polyolefins, polymethylmethacrylates, polyurethanes and the like.

The Binder

In general terms, the binder component of the electrically conductive sheet materials of the present invention should be a dielectric material that in its uncured, unhardened or molten condition is a liquid of sufficiently low viscosity to permit alignment of the ferromagnetic particles used in the method of the present invention. The dielectric binder can be most any material that can be coated, has sufficiently low viscosity during the magnetic particle orientation step, and is capable of undergoing a cure or other hardening step to maintain the orientation of the particles in the final product.

The binder may have adhesive or elastomeric properties, as desired. When the dielectric binder is an adhesive, it is particularly well adapted to pressure sensitive adhesives. When the binder is non-adhesive and the conductive sheet material is used to electrically connect electrodes on rigid substrates, there can be advantages to having the binder be compressible; a preferred material would be an elastomer, such as silicone rubber. An elastomer is a cross-linked, amorphous polymer at a temperature above its $T_g$.

When compliance does not have to be built into the dielectric binder phase, a number of materials may be used with their selection based on other desired properties, e.g., if the conductive sheet material is used for burn-in testing of electric components, where elevated temperatures are used, it may be advantageous to use polyimide or epoxy as the dielectric material.

More than one type of binder may be utilized in an electrically conductive sheet material of the present invention. For example, an adhesive material may be applied as a slurry of magnetic particles into grooves in a carrier web with an elastomeric layer or non-adhesive layer provided over the adhesive layer. Any combination of suitable dielectric binders may be utilized. However, it is preferred that a single binder be used throughout an electrically conductive sheet material.

Adhesives useful in sheet materials of the invention may be selected from thermoplastic and thermosetting adhesives, rubber resin adhesives, pressure-sensitive adhesives, and the like.

A preferred class of pressure-sensitive adhesives are acrylate adhesives. They can be monomers and/or oligomers such as (meth)acrylates, (meth)acrylamides, vinyl pyrrolidone and azlactones. Such monomers include mono-, di-, or poly-acrylates and methacrylates.

Preferred acrylates are typically alkyl acrylates, preferably monofunctional unsaturated acrylate esters of non-tertiary alkyl alcohols, the alkyl groups of which have from 1 to about 14 carbon atoms. Included with this class of monomers are, for example, isooctyl acrylate, isononyl acrylate, 2-ethylhexyl acrylate, decyl acrylate, dodecyl acrylate, n-butyl acrylate, and hexyl acrylate.

Preferred monomers include isooctyl acrylate, isononyl acrylate, 2-ethylhexyl acrylate, and butyl acrylate. The alkyl acrylate monomers can be used to form homopolymers or they can be copolymerized with polar copolymerizable monomers.

The polar copolymerizable monomers can be selected from strongly polar monomers, such as monoolefinic mono- and dicarboxylic acids, hydroxyalkyl acrylates, cyanoalkyl acrylates, acrylamides or substituted acrylamides, or from moderately polar monomers such as N-vinyl pyrrolidone, acrylonitrile, vinyl chloride or diallyl phthalate.

Where superior cohesive strengths are desired, the pressure-sensitive adhesive binder may also be cross-linked. Preferred crosslinking agents for the acrylic pressure-sensitive adhesive binder are multiacrylates such as 1,6-hexanediol diacrylate.

Another preferred class of pressure-sensitive adhesives are siloxane pressure-sensitive adhesives, e.g., "DC 284", available from Dow Corning, and poly(diphenylsiloxane) containing pressure-sensitive adhesives, e.g., "GE 6574", available from General Electric Company.

A useful adhesive that becomes pressure-sensitive at elevated temperatures is disclosed in U.S. Pat. No. 4,880,693, (Stow), useful heat-hardenable adhesives are disclosed in U.S. Pat. Nos. 3,733,755 and 3,326,741, (both Olson).

Other useful materials which can be blended into the binder include, but are not limited to, pigments, plasticizers, tackifiers, foaming agents, antioxidants, stabilizers, fire retardants, and rheological modifiers.

Suitable elastomers for use as binders in the present invention include natural rubber, styrene-butadiene rubber, styrene-acrylonitrile rubber, neoprene, butyl rubber, polybutadiene, polyisoprene, ethylene-propylene copolymer rubber (EPDM), polyfluorocarbon elastomers, silicone elastomers, polyepichlorohydrin, and other suitable elastomers.

The Particles

It is necessary that some portion of the conductive particles, preferably some portion of each of the conductive particles, be ferromagnetic. It is preferable that the ferromagnetic particles are spherical or approximately spherical, but the magnetic particles may be of any shape. They may be solid or hollow particles. Suitable magnetic materials include nickel, cobalt, and iron and their magnetic alloys. The particles can have a ferromagnetic core and a coating of a conductive material that need not be ferromagnetic, or a magnetic coating over a non-magnetic core.

Particles of a wide range of sizes are useful in the present invention, but typically the magnetic particles will have a size of about 5 $\mu$m–50 $\mu$m. It may be desirable to provide particles that are sufficiently small so as to fill the points or bottom portions of a recess prior to coating larger size magnetic particles over the smaller particles first coated into the recesses. By providing smaller particles in the tip or bottom of a recess, adhesive or other binder material is prevented from occupying the ultimate bonding site in the electrically conductive sheet material. It may also be desirable to have recesses that have a radius at the bottom of the recess that is about the size of the particles selected.

The invention is further described by the following non-limiting examples, wherein all parts are by weights unless otherwise indicated.

Example 1

An electrically conductive sheet material of the present invention was made according to the following method. A 75 $\mu$m thick biaxially oriented poly(ethylene terephthalate) film (PET) was coated on both sides with 37 $\mu$m of low density polyethylene. One face of this film was embossed to have 98 recesses per cm arranged in a square lattice array to provide 9604 recesses per square cm. Each recess was a truncated pyramid having a square bottom (about 37 $\mu$m on a side), a square top (about 47 $\mu$m on a side), and a depth of about 37 $\mu$m. The embossed surface was coated with "SYL-OFF" 292 silicone release (Dow Corning, Midland, Mich.). The silicone release coating was applied by spraying a solution containing 0.1% weight solids from a solvent consisting of 90 parts of "PENOLA" 100 (Simonsons C. F., Sons; Philadelphia, Pa.), 5 parts isopropanol and 5 parts toluene until the surface of the embossed film was wet. The film was dried at room temperature and then cured at 95° C. for 10 min.

A slurry consisting of 1 g of isooctyl acrylate (IOA) homopolymer syrup (100 parts IOA monomer polymerized to 5–10% conversion using 0.04 parts of 2,2-dimethoxy-2-phenyl acetophenone and UV light), 4 g additional IOA monomer and 22.5 g of INCO 123 nickel powder (from NOVAMET, Wyckoff, N.J.) were flooded onto the embossed film and then wiped with a poly(tetrafluoroethylene) blade such that the slurry existed substantially in the recesses of the embossed film. The film was then overcoated with 50 $\mu$m of a syrup consisting of (90 parts IOA, 10 parts acrylic acid copolymerized to 5 to 10% conversion using 0.04 parts 2,2-dimethoxy-2-phenyl acetophenone and UV light)0.1 parts hexanediol diacrylate and an additional 0.2 parts 2,2-dimethoxy-2-phenyl acetophenone. The silicone coated side of the release liner (50 $\mu$m PET available from Toray as "CERAPEEL with BK coating one side") was laminated to the adhesive. The laminate was successively moved through magnetic fields of 2000 Oersteds and UV lights for five minutes. The laminate was cured an additional 3 minutes under UV light. The UV light used throughout this example was from a desk lamp that had two UV lamps (General Electric F15T8 BL).

A section was cut from the laminate and examined with an optical microscope. There were from one to three chains of nickel particles at each recess in the embossed film. These chains of particles extended through the thickness of the adhesive. Some particle chains were also observed between the recesses but clumps of particles that could result in bridging or short circuiting between embossed sites were not observed. From this examination, it appeared that this material would provide a conductive transfer adhesive with a useable pitch of 98 conductive sites per cm.

The conductive transfer adhesive of this example was used to form a 10 mm by 20 mm bond between two 1 mm thick aluminum strips. The resistance of the bond ranged from 20 to 2000 ohms depending on the stress applied to the bond, e.g. pressing the aluminum strips together reduced the resistance. After aging over night at room temperature, the resistance stabilized at about 20 ohms.

Example 2

An electrically conductive sheet material of the present invention was made according to the following method. A 1 mm thick by 45 cm by 45 cm nickel sheet was electroformed from an acrylic plastic sheet having a diamond machined pattern of parallel ridges machined into one side. The pattern had a uniform cross section forming 90° interplanar angles at the ridges and grooves and a ridge to ridge spacing of 50 $\mu$m. This electroformed nickel sheet was then formed around a mandrel to make an embossing roll 45 cm wide and 15 cm in diameter. This embossing roll was used to emboss the ridge pattern into a sheet of polypropylene 200 $\mu$m thick, 30 cm wide, and 10 m long. The embossing was done at a web speed of 1 m/min and a pressure of 280 kPa. The embossing roll was prewarmed to 145° C. Two square pieces measuring 5 cm by 5 cm were cut from the polypropylene and placed so that the embossed side of one piece was against the embossed side of the other, but turned so that the embossed ridges of the two pieces were 90° to one another. Prior to placing the polypropylene pieces together, 3 drops (about 0.15 g) of a liquid slurry were placed in the center of one piece. The slurry was made by mixing 1 g of fine silver coated nickel particles (20 μm diameter and less) with 2.63 g of an uncured room temperature vulcanizing silicone rubber. The silver coated nickel particles were obtained from Novamet of Wyckoff, N.J. (Labeled by Novamet as "fines," with 15 weight percent silver). The uncured silicone rubber was prepared in the following way: General Electric RTV 609, a vinyl terminated polymethylsiloxane with a molecular weight of 40,000, was mixed with 2 weight percent of a polymethylhydrosiloxane with a ratio of 2:1 $(CH_3)_2SiO$ inactive sites to $CH_3HSiO$ active sites and an average of 50 Si—O units per molecule to act as a cross-linking agent. In addition, 2 wt % of a solution of 99 weight percent acetone and 1 weight percent cyclopentadienyltrimethylplatinum (as described by S. D. Robinson and B. L. Shaw in J. Chem. Soc. 1965, pp. 1529-30) was mixed with the RTV 609 and the crosslinking agent to act as a catalyst. After mixing, this material was degassed in a vacuum to remove the acetone and entrapped air bubbles. The two polypropylene pieces and the slurry formed a sandwich with the slurry contained between the two polypropylene pieces. This sandwich was compressed together by placing it between the face of a permanent magnet and a glass slide. The magnet formed a magnetic field with a strength estimated to be 1500 Oersteds and with the lines of magnetic flux perpendicular to the face of the magnet. The glass slide was pressed against the sandwich with sufficient force (roughly 100 grams force), to spread the slurry out to form a circular disk about 3 cm in diameter and 100 μm average thickness. Within the slurry, the nickel particles formed chains through the thickness of the polymer and in a square array of 50 μm spacing with the tops and bottoms of the chains in the grooves of the polypropylene backing. There were no chains formed outside of the groves. The silicone was then cured to form an elastomer by exposing a 25 watt UV light 3 cm from the polypropylene sandwich, through the glass slide for 5 minutes followed by an oven,cure at 90° C. for 15 minutes. The polypropylene backings were then peeled away from the cured silicone.

The resulting elastomer had through-thickness electrical conductivity but no measurable transverse conductivity. The membrane was compressed with various forces between a sheet of copper and a flat probe from an ohmmeter which had a circular area of 0.48 mm². The resistance from the center of the sample as a function of pressure was:

| Pressure (kPa) | Resistance (ohms) |
| --- | --- |
| 41 | 40 |
| 157 | 5.1 |
| 271 | 3.8 |
| 424 | 3.0 |
| 638 | 1.4 |
| 1000 | 0.7 |
| 1220 | 0.7 |
| 1230 | 0.6 |

Example 3

An electrically conductive sheet material of the present invention was made according to the methods substantially similar to that described in Example 2 except that the embossed pattern was a plurality of three-sided inverted pyramids with a center-to-center spacing of 100 μm and a depth of 61 μm. The embossed polypropylene backings were aligned so that the opposing recesses were directly opposite one another by means of observing the Moire patterns formed by light passing through the polypropylene and then moving the pieces relative to one another until the Moire pattern was eliminated and the maximum amount of light passed through the construction. After the sample was cured and the embossed backings were removed, the membrane thickness was measured to be 150 μm between the projections at opposing surfaces of the resulting membrane. All of the projections extended from the recesses. The resistance through the sample of a 0.48 mm² area near the center of the sample as a function of pressure was:

| Pressure (kPa) | Resistance (ohms) |
| --- | --- |
| 169 | 37 |
| 204 | 23 |
| 292 | 7.8 |
| 516 | 5.0 |
| 824 | 3.1 |
| 1040 | 2.4 |
| 1250 | 1.8 |

Comparative Example A

An electrically conductive sheet material was made according to the methods described in Example 2 except that, instead of using embossed backings, smooth pieces of PET were used as the backings. The intent was to provide a comparison between the conductive sheet materials made by using the embossed backing according the present invention and conductive sheet materials made without embossed backings. The sample thickness was found to be 100 μm. Resistance through a 0.48 mm² area of the sample as a function of pressure was:

| Pressure (kPa) | Resistance (ohms) |
| --- | --- |
| 61 | 161 |
| 137 | 71 |
| 245 | 20 |
| 286 | 16 |
| 367 | 12 |
| 632 | 5.6 |
| 795 | 5.5 |
| 969 | 4.3 |
| 1030 | 4.7 |

This example shows that the electrical conductivity through the conductive sheet material is enhanced by having the conductive chains terminate at protrusions on the surface of the conductive sheets.

We claim:

1. An electrically conductive sheet material conductive through its thickness but not measurably conductive in the transverse direction, said sheet comprising:
a polymeric sheet having first and second faces;
said first face having a regular array of protrusions extending therefrom, said protrusions defining conductive corridors lying between said protrusions and said second face, with a dielectric region surrounding said conductive corridors;
a plurality of magnetic columns, each column including individual electrically conductive ferromagnetic particles magnetically aligned from a mixture of said ferromagnetic particles and a dielectric binder to form a continuous column, said magnetic columns lying in said conductive corridors, extending from protrusions in said first face to said second face; and providing conductivity between said first and second faces;

said dielectric region surrounding said conductive corridors preventing electrical conductivity therebetween.

2. The electrically conductive sheet material of claim 1 further including a plurality of protrusions in said second face, said conductive corridors extending between a protrusion in said first face and a protrusion in said second face.

3. The electrically conductive sheet material of claim 1 wherein said polymeric sheet is an adhesive.

4. The electrically conductive sheet material of claim 1 wherein said polymeric sheet is an elastomer.

5. The electrically conductive sheet material of claim 1 further including a release liner positioned over said first face having recesses corresponding to said protrusions extending from said first face.

6. The electrically conductive sheet material of claim 2 further including a pair of release liners provided over said first and second faces, said release liners having recesses corresponding to said protrusions.

7. An electrically conductive sheet material comprising:
a polymeric sheet having first and second faces;
said first face having a first set of longitudinally extending, parallel ridges formed therein;
the ridges of said first face being at an angle with respect to the ridges of said second face;
grid points in the ridges of the first and second faces corresponding to the points at which the ridges would intersect if the ridges were in the same plane;
a plurality of magnetic columns in a regular array, each column including individual electrically conductive ferromagnetic particles aligned to form a continuous column extending from said first face to said second face positioned at the grid points of said first and second set of ridges.

8. The electrically conductive sheet material of claim 7 wherein said polymeric sheet is an adhesive.

9. The electrically conductive sheet material of claim 7 wherein said polymeric sheet is an elastomer.

10. The electrically conductive sheet material of claim 7 further including a pair of release liners provided over said first and second faces, said release liners having a plurality of grooves corresponding to the ridges in said first and second faces.

11. An electrically conductive sheet material comprising:
a carrier web having a first face having a plurality of recesses formed therein;
a dielectric material;
a plurality of magnetically aligned electrically conductive ferromagnetic columns in a regular array, said columns extending from said recesses and being surrounded by said dielectric material; and
a first polymeric layer provided over said first face and said plurality of magnetic columns;
wherein said sheet is electrically non-conductive in the transverse direction.

12. The electrically conductive sheet material of claim 11 further including a second polymeric layer.

13. The electrically conductive sheet material of claim 12 wherein said magnetic columns protrude from said second polymeric layer.

14. The electrically conductive sheet material of claim 12 wherein said second polymeric layer is an adhesive.

15. A sheet material capable of providing electrical conductivity through its thickness but not laterally in the plane thereof comprising:
a sheet having first and second faces, each of said faces having a set of longitudinally extending parallel ridges therein,
a regular array of magnetically aligned conductive columns, each column including a plurality of individual electrically conductive, ferromagnetic particles which provide a continuous column from the ridges in said first face to the ridges in the second face, each column being surrounded by a dielectric polymeric material.

* * * * *

UNITED STATES PATENT AND TRADEMARK OFFICE
CERTIFICATE OF CORRECTION

PATENT NO. : 5,443,876
DATED : August 22, 1995
INVENTOR(S) : Koskenmaki et al.

It is certified that error appears in the above-indentified patent and that said Letters Patent is hereby corrected as shown below:

Col. 1, line 59        "Ikade" should be —Ikeda—

Col. 2, line 58        "groves" should be —grooves—

Col. 3, line 28        "groves" should be —grooves—

Col. 5, line 21        "groves" should be —grooves—

Col. 7, line 2         "memagnetic" should be —magnetic—

Col. 9, line 9         "4,880,693" should be —4,880,683—

Col. 9, line 10        "3,733,755" should be —3,753,755—

Col. 11, line 40       "groves" should be —grooves—

Signed and Sealed this

Second Day of April, 1996

*Attest:*

BRUCE LEHMAN

*Attesting Officer*    *Commissioner of Patents and Trademarks*